US012584234B2

(12) United States Patent
Lin et al.

(10) Patent No.: US 12,584,234 B2
(45) Date of Patent: Mar. 24, 2026

(54) CASING STRUCTURE OF ELECTRONIC DEVICE AND MANUFACTURING METHOD THEREOF

(71) Applicant: Acer Incorporated, New Taipei (TW)

(72) Inventors: Tzu-Wei Lin, New Taipei (TW);
Chih-Chun Liu, New Taipei (TW);
Cheng-Nan Ling, New Taipei (TW);
Wen-Chieh Tai, New Taipei (TW)

(73) Assignee: Acer Incorporated, New Taipei City (TW)

( * ) Notice: Subject to any disclaimer, the term of this patent is extended or adjusted under 35 U.S.C. 154(b) by 324 days.

(21) Appl. No.: 18/177,731

(22) Filed: Mar. 2, 2023

(65) Prior Publication Data

US 2024/0068119 A1        Feb. 29, 2024

Related U.S. Application Data

(60) Provisional application No. 63/400,411, filed on Aug. 24, 2022.

(30) Foreign Application Priority Data

Oct. 5, 2022        (TW) .................................. 111137894

(51) Int. Cl.
| | |
|---|---|
| *C25D 13/14* | (2006.01) |
| *C09D 5/44* | (2006.01) |
| *C25D 13/20* | (2006.01) |
| *C25D 13/22* | (2006.01) |
| *H05K 5/04* | (2006.01) |

(52) U.S. Cl.
CPC ............ *C25D 13/14* (2013.01); *C09D 5/4411* (2013.01); *C09D 5/443* (2013.01); *C25D 13/20* (2013.01); *C25D 13/22* (2013.01); *H05K 5/04* (2013.01)

(58) Field of Classification Search
CPC ....... C25D 13/14; C09D 5/4411; C09D 5/443
See application file for complete search history.

(56) References Cited

U.S. PATENT DOCUMENTS

| | | | | | |
|---|---|---|---|---|---|
| 5,203,975 | A | * | 4/1993 | Richardson | .......... C09D 5/4492 204/501 |
| 6,117,298 | A | * | 9/2000 | Nakatsugawa | ........ C25D 11/00 205/108 |

FOREIGN PATENT DOCUMENTS

| | | |
|---|---|---|
| CN | 110936674 | 3/2020 |
| CN | 113930828 | 1/2022 |
| CN | 114929938 | 8/2022 |
| TW | 202102357 | 1/2021 |
| TW | 202124773 | 7/2021 |

* cited by examiner

*Primary Examiner* — Nathan T Leong
(74) *Attorney, Agent, or Firm* — JCIPRNET

(57) ABSTRACT

A casing structure of electronic device including a metal base plate, a transparent cathodic electrodeposition paints layer, and a transparent paints coating layer is provided. The metal base plate has brushed texture and high gloss surface. The transparent cathodic electrodeposition paints layer is disposed on the base metal base plate. The transparent paints coating layer is disposed on the transparent cathodic electrodeposition paints layer. A manufacturing method of casing structure of electronic device is also provided.

9 Claims, 4 Drawing Sheets

100

S110 — Metal base plate surface treatment

S120 — Forming Phosphate film

S130 — Cathodic electroplating coating

S140 — Spraying color paste

S110 {

S111 — Grinding and Polishing

S112 — Wire drawing

S121 — Ultrasonic degreasing

S122 — Warm water washing

S123 — Water washing

S124 — Film formation

S125 — Warm water washing

S126 — Pure water washing

S127 — Drying

S131 — Hanging the metal base plate and washing it with pure water

S132 — Electrode positioning

S133 — Pure water washing

S134 — Pure water washing

CASING STRUCTURE OF ELECTRONIC DEVICE AND MANUFACTURING METHOD THEREOF

CROSS-REFERENCE TO RELATED APPLICATION

This application claims the priority benefit of U.S. provisional application Ser. No. 63/400,411, filed on Aug. 24, 2022, and Taiwan application serial no. 111137894, filed on Oct. 5, 2022. The entirety of each of the above-mentioned patent applications is hereby incorporated by reference herein and made a part of this specification.

BACKGROUND

Technical Field

The disclosure relates to a casing structure of electronic device and a manufacturing method thereof.

Description of Related Art

Metal casings are widely used in existing electronic devices due to the characteristics. However, in the manufacturing process, in order to avoid adverse effects such as corrosion and wear, an anti-oxidation layer is often applied on the metal base plate, for example, a magnesium oxide film is formed on the surface of the magnesium alloy to protect the surface of the metal base plate.

However, the above-mentioned anti-oxidation layer will affect the appearance of the metal base plate, for example, the original surface gloss of the metal base plate will be lost. Therefore, it is still necessary to use coatings added with metal powder or without inorganic material in the subsequent process to make up for the aforementioned defects by the simulation effect produced by the pseudo-metal texture. However, there is still a significant gap between the visual effect produced by this move and the texture produced by the raw material of the metal base plate.

SUMMARY

A casing structure of electronic device and a manufacturing method thereof are provided in the application, which presents the texture and visual effect that the metal base plate raw material has.

A casing structure of electronic device including a metal base plate, a transparent cathodic electrodeposition paints layer, and a transparent paints coating layer is provided in the application. The metal base plate has brushed texture and high gloss surface. The transparent cathodic electrodeposition paints layer is disposed on the metal base plate. The transparent paints coating layer is disposed on the transparent cathodic electrodeposition paints layer.

A manufacturing method of casing structure of electronic device is provided in the application, which includes providing a metal base plate, and the metal base plate has brushed texture and high gloss surface. Then, the metal base plate is cathodic electrode positioned to form a transparent cathodic electrodeposition paints layer on the brushed texture. And then, a transparent paints coating layer is sprayed on the transparent cathodic electrodeposition paints layer.

Based on the above, in the casing structure of electronic device and the manufacturing method thereof, which is first configured on the metal base plate with the transparent cathodic electrodeposition paints layer, and then applied with the transparent paints coating layer. Therefore, when both the electrodeposition paints layer and the paints coating layer are highly transparent, the brushed texture and high gloss surface of the metal base plate can be presented completely and without damage. And it can also provide the required protection for the surface of the metal base plate.

DESCRIPTION OF THE EMBODIMENTS

Figure 1:
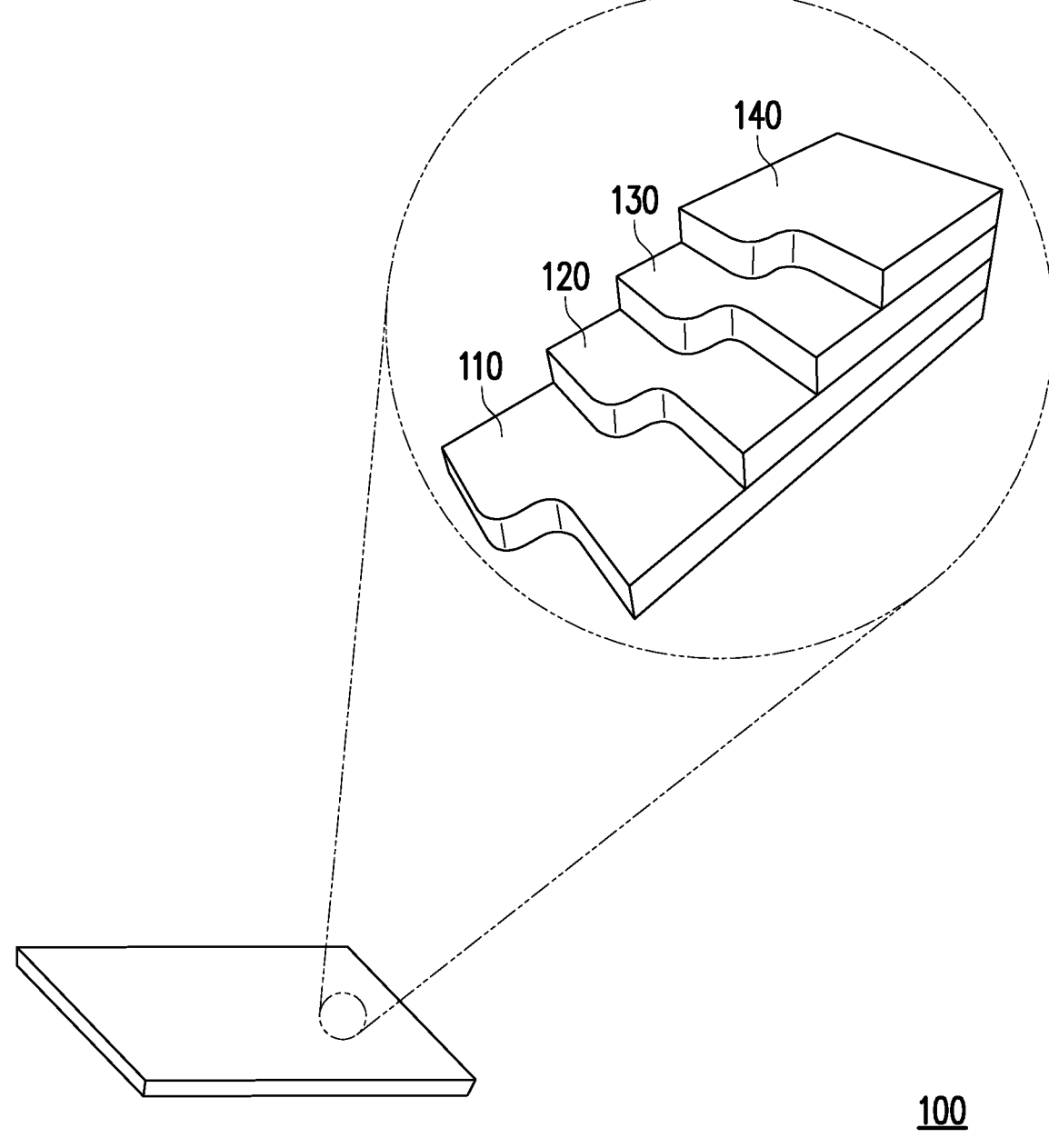
FIG. 1 is a schematic diagram of a casing structure of an electronic device according to an embodiment of the application.
Figures 2, 3:
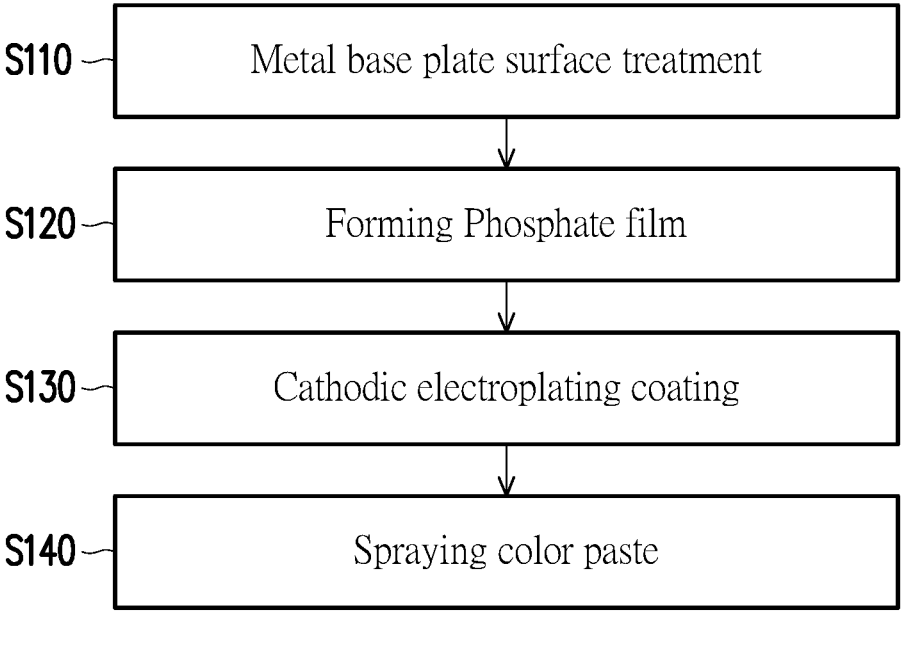
FIG. 2 is a flow chart of a manufacturing method of a casing structure of an electronic device.
FIG. 3 to FIG. 5 is respectively the detailed flow chart of FIG. 2.
Figure 4:
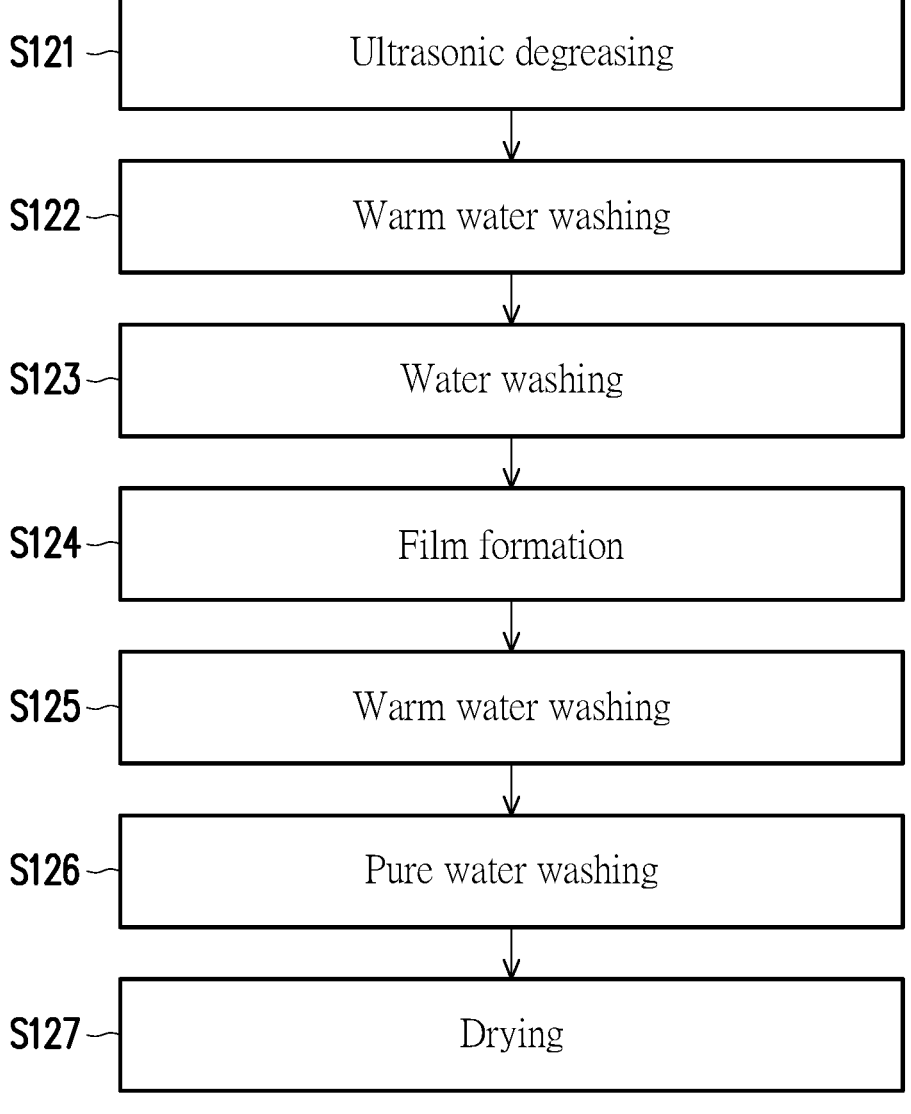
Figure 5:
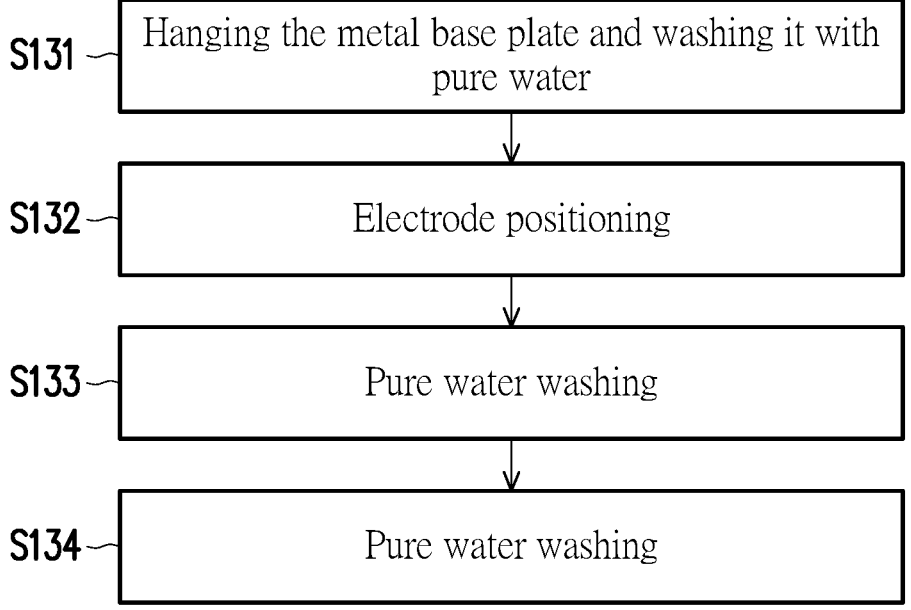

FIG. 1 is a schematic diagram of a casing structure of an electronic device according to an embodiment of the application. FIG. 2 is a flow chart of a manufacturing method of a casing structure of an electronic device. FIG. 3 to FIG. 5 is respectively the detailed flow chart of FIG. 2. Referring to FIG. 1 to FIG. 3, in the embodiment, the casing structure (hereinafter referred to as "casing structure 100") of the electronic device includes a metal base plate 110, a phosphating film 120, a transparent cathodic electrodeposition paints layer 130, and a transparent paints coating layer 140, wherein the surface of the metal base plate 110 has brushed texture and high gloss surface. The phosphating film 120 is disposed on the metal base plate 110 to cover the surface of the metal base plate 110. The transparent cathodic electrodeposition paints layer 130 is successively disposed on the phosphating film 120. Then, the transparent paints coating layer 140 is successively disposed on the transparent cathodic electrodeposition paints layer 130.

Furthermore, when a magnesium-aluminum alloy or a magnesium-lithium alloy is finished by stamping or a related forming process to complete the preliminary production of the metal base plate 110, and then the metal base plate 110 is subjected to surface treatment prior to step S110 to generate the aforementioned brushed texture as shown in FIG. 2 and FIG. 3. In the embodiment, the surface treatment of step S110 includes step S111, which firstly grinds and polishes the surface of the metal base plate 110, including rough grinding, fine grinding and polishing. Wherein the polishing process includes magnetic polishing, hemp wheel polishing and cloth wheel polishing in sequence. The magnetic polishing is to polish the surface of the metal base plate 110 by the magnetic induction polishing body in the fluid and the guidance of the magnetic field. Then, the hemp wheel and cloth wheel are used for polishing in sequence, so that the surface of the metal base plate 110 can be polished by the hemp wheel to create metal high-gloss. And then, the surface of the metal base plate 110 is polished with a cloth wheel to form a light-receiving effect. In addition, depending on the required polishing conditions, the required metal high-gloss effect on the metal surface can also be achieved by CNC milling.

Next, in step S112, a wire drawing process is performed on the surface of the metal base plate 110, that is, a mechanical brush milling is applied to form a brushed texture. Here is a treadmill type wire drawing machine, the above-mentioned polished metal base plate 110 is placed on the wire drawing machine through a jig, and a 320 # nylon wheel is used to draw back and forth twice.

Then, referring to FIG. 2 and FIG. 4 at the same time, it is the detailed process flow of step S120. In step S120, phosphating is applied to the surface of the metal base plate 110, and especially a transparent phosphating film 120 is formed. Here, the phosphating film 120 includes zirconium compounds and resins to protect the metal base plate 110 and prevent the metal base plate 110 from being corroded and used as a primer process before painting (that is, the resin component is effectively combined with the subsequent paint and varnish). In this way, the adhesion and corrosion resistance of the subsequent painting layer can be improved, and it can also provide friction-reducing lubrication in the metal cold working process. As shown in FIG. 4, step S120 further includes steps S121 to S127, which are described respectively as follows. Step S121: Performing ultrasonic degreasing on the previously polished metal base plate 110 (for example, at 50±3° C. for 2-3 minutes). Step S122: Warm water washing (35° C., 30 seconds). Step S123: Water washing (30 seconds). Step S124: Film formation (35° C., 15 seconds). Step S125: Warm water washing (30 seconds). Step S126: Pure water washing (30 seconds). Step S127: Drying (80° C., 15 minutes).

Then, referring to FIG. 2 and FIG. 5 at the same time, step S130 is performed to apply cathodic electroplating (CED) on the aforementioned phosphating film 120 to form a transparent cathodic electrodeposition paints layer 130 with high transparency. Here, the transparent cathodic electrodeposition paints layer 130 includes epoxy resins and acrylic resins. In addition to cost savings due to the properties of water-soluble coatings, as well as avoiding the dangers and contamination of organic solvents, cathodic electrode positioning also features uniform film thickness, strong adhesion, and good coating quality. Therefore, a uniform and smooth painting film can be obtained for each different part on the metal base plate 110, such as inner layer, depression, welding seam, etc., which solves the difficulty of painting workpieces with complex shapes by other painting methods. Step S130 further includes the following steps. Step S131: Hanging the above-mentioned metal base plate 110 with a film formed on the surface and wash it with pure water (20 seconds). Step S132: Electrode positioning (electrophoresis voltage 110V, 80 seconds). Step S133: Pure water washing (30 seconds). Step S134: Drying (120° C., 20 minutes).

And then, step S140 is executed. A transparent color paste is sprayed on the aforementioned transparent cathodic electrodeposition paints layer 130 to form a transparent paints coating layer 140. And the transparent paints coating layer 140 of the embodiment includes acrylic resins, wherein the film thickness of the paint (matte finish) is 22 μm. After coating, it was baked (80° C., 40 minutes). After the baking is completed, increase the baking time for 8 hours and let it stand for 24 hours to form a finished product with a gloss of 30 degrees. At this point, the manufacturing process of the surface of the metal base plate 110 is completed. Due to the high transparency of the aforementioned transparent phosphating film 120, transparent cathodic electrodeposition paints layer 130 and transparent paints coating layer 140, the brushed texture and high gloss surface of the metal base plate 110 can be revealed.

In summary, in the above-described embodiments of the application, the casing structure of the electronic device and the manufacturing method thereof first performs surface polishing and brush milling on the metal substrate. After making it show brushed texture and high gloss surface, then the transparent phosphating film is formed on the surface for preliminary anti-corrosion protection. Next, the transparent cathodic electrodeposition paints layer is successively formed and stacked on the metal base plate, and then the transparent paints coating layer is applied. In this way, when both the electrodeposition paints layer and the paints coating layer are highly transparent, the brushed texture and high gloss surface of the metal base plate can be presented completely and without damage, and can also provide the required protection for the surface of the metal base plate.

What is claimed is:

1. A manufacturing method of a casing structure of an electronic device comprising:

providing a metal base plate, the metal base plate has a brushed texture and high gloss surface;

cathodic electrode positioning the metal base plate and forming a transparent cathodic electrodeposition paints layer on the brushed texture and high gloss surface; and spraying a transparent paints coating layer on the transparent cathodic electrodeposition paints layer, wherein the high gloss of the brushed texture and high gloss surface of the metal base plate is produced by the sequential processing of rough grinding, fine grinding, magnetic polishing, hemp wheel polishing and cloth wheel polishing.

2. The manufacturing method according to claim 1, further comprises:

phosphating the metal base plate to form a transparent phosphating film on the brushed texture and high gloss surface before cathodic electrode positioning the metal base plate.

3. The manufacturing method according to claim 2, wherein the transparent phosphating film comprises zirconium compounds and resins.

4. The manufacturing method according to claim 2, wherein the manufacturing process of forming a transparent phosphating film comprises degreasing, warm water washing, water washing, film formation, warm water washing, pure water washing and drying in sequential order.

5. The manufacturing method according to claim 1, wherein the transparent cathodic electrodeposition paints layer comprises epoxy resins and acrylic resins.

6. The manufacturing method according to claim 1, wherein the transparent paints coating layer comprises acrylic resins.

7. The manufacturing method according to claim 1, wherein the metal base plate is a magnesium-aluminum alloy or a magnesium-lithium alloy.

8. The manufacturing method according to claim 1, wherein the brushed texture of the brushed texture and high gloss surface of the metal base plate is produced by drawing 320# nylon wheel back and forth twice.

9. The manufacturing method according to claim 1, wherein the manufacturing process of cathodic electrode positioning comprises hanging the metal substrate to perform pure water cleaning, electrode positioning, pure water cleaning and drying in sequence.

* * * * *